United States Patent
Stephens et al.

[11] Patent Number: 5,913,108
[45] Date of Patent: Jun. 15, 1999

[54] LASER DIODE PACKAGING

[75] Inventors: Edward F. Stephens, Dittmer; Dean W. Micke, Marthasville, both of Mo.; Alan D. Boxell, Dupo, Ill.

[73] Assignee: Cutting Edge Optronics, Inc., St. Charles, Mo.

[21] Appl. No.: 09/070,859

[22] Filed: Apr. 30, 1998

[51] Int. Cl.$^6$ .................................................. H01S 3/04
[52] U.S. Cl. ........................ 438/109; 438/106; 372/45; 372/50; 257/675; 257/718; 257/719
[58] Field of Search .................................. 438/106, 107, 438/109; 372/45, 50, 36, 76; 257/675, 718, 719

[56] References Cited

U.S. PATENT DOCUMENTS

| | | |
|---|---|---|
| 3,339,151 | 8/1967 | Smith . |
| 3,590,248 | 6/1971 | Chatterton, Jr. . |
| 3,771,031 | 11/1973 | Kay . |
| 3,962,655 | 6/1976 | Selway et al. . |
| 4,092,614 | 5/1978 | Sakuma et al. . |
| 4,315,225 | 2/1982 | Allen, Jr. et al. . |
| 4,383,270 | 5/1983 | Schelhorn . |
| 4,393,393 | 7/1983 | Allen, Jr. et al. ........................ 357/81 |
| 4,454,602 | 6/1984 | Smith . |
| 4,573,067 | 2/1986 | Tuckerman et al. . |
| 4,617,585 | 10/1986 | Yasui . |
| 4,716,568 | 12/1987 | Scifres et al. . |
| 4,831,629 | 5/1989 | Paoli et al. . |
| 4,847,848 | 7/1989 | Inoue et al. . |
| 4,877,641 | 10/1989 | Dory . |
| 4,881,237 | 11/1989 | Donnelly . |
| 4,899,204 | 2/1990 | Rosen et al. ........................ 357/30 |
| 4,901,330 | 2/1990 | Wolfram et al. . |
| 4,975,923 | 12/1990 | Buus et al. . |

(List continued on next page.)

FOREIGN PATENT DOCUMENTS

| | | | |
|---|---|---|---|
| 0 458 469 A1 | 11/1991 | European Pat. Off. | 257/675 |
| 0 550 996 A1 | 1/1992 | European Pat. Off. | H01S 3/025 |
| 0 634 822 A1 | 1/1995 | European Pat. Off. | H01S 3/00 |

OTHER PUBLICATIONS

Endriz et al., "High Power Diode Laser Arrays," IEEE J. Quantum Electronics 28 (1992) Apr. No. 4, pp. 952–965.
Coherent Laser Group, Laser Diodes and Bars (article) (5 pages).
IBM Tech. Dis. Bull. 31(12), May 1989, pp. 5–7.
IBM Tech. Dis. Bull. 31(6), Nov. 1988, pp. 372–373.
Thomson–CSF Semiconducteurs Specifiques, Package Specification (schematic), p. 3 (one page).

*Primary Examiner*—Charles Bowers
*Assistant Examiner*—Martin Sulsky
*Attorney, Agent, or Firm*—Arnold White & Durkee

[57] ABSTRACT

A laser diode assembly includes a laser diode having an emitting surface and a reflective surface opposing the emitting surface. Between the emitting and reflective surfaces, the laser diode has first and second surfaces to which a first heat sink and second heat sink are attached, respectively, via a solder bond. A spacer element is disposed between the first and second heat sinks and is below the laser diode. The spacer element has a width that is chosen to provide optimum spacing between the first and second heat sinks. The spacer element has a height that is chosen to place the emitting surface of the laser diodes at a position that is substantially flush with the upper surfaces of the heat sinks. A substrate is positioned below the first and second heat sinks and is attached to these two components usually via a solder bond. The substrate is preferably of a nonconductive material so that electrical current flows only through the heat sinks and the laser diode. To properly locate the spacer element, the substrate may include a locating channel into which the spacer element fits. Each of the heat sinks is coated with a solder layer prior to assembly. Once the components are placed in their basic assembly position, only one heating step is needed to cause the solder layer on the heat sinks to reflow and attach each heat sink to the adjacent laser diodes and also to the substrate.

40 Claims, 7 Drawing Sheets

U.S. PATENT DOCUMENTS

| | | |
|---|---|---|
| 5,022,042 | 6/1991 | Bradley . |
| 5,031,187 | 7/1991 | Orenstein et al. . |
| 5,040,187 | 8/1991 | Karpinski . |
| 5,073,838 | 12/1991 | Ames . |
| 5,099,488 | 3/1992 | Ahrabi et al. ............................ 372/361 |
| 5,105,429 | 4/1992 | Mundinger et al. . |
| 5,128,951 | 7/1992 | Karpinski . |
| 5,156,999 | 10/1992 | Lee . |
| 5,163,064 | 11/1992 | Kim et al. . |
| 5,212,699 | 5/1993 | Masuko et al. . |
| 5,216,263 | 6/1993 | Paoli . |
| 5,216,688 | 6/1993 | Kortz et al. . |
| 5,284,790 | 2/1994 | Karpinski . |
| 5,287,375 | 2/1994 | Fujimoto . |
| 5,305,344 | 4/1994 | Patel . |
| 5,311,535 | 5/1994 | Karpinski . |
| 5,311,536 | 5/1994 | Paoli et al. . |
| 5,323,411 | 6/1994 | Shirasaka et al. . |
| 5,325,384 | 6/1994 | Herb et al. . |
| 5,337,325 | 8/1994 | Hwang . |
| 5,351,259 | 9/1994 | Ishimori et al. . |
| 5,394,426 | 2/1995 | Joslin . |
| 5,394,427 | 2/1995 | McMinn et al. . |
| 5,402,436 | 3/1995 | Paoli . |
| 5,402,437 | 3/1995 | Mooradian . |
| 5,438,580 | 8/1995 | Patel et al. . |
| 5,526,373 | 6/1996 | Karpinski . |
| 5,663,979 | 9/1997 | Marshall . |
| 5,764,675 | 7/1996 | Juhala . |
| 5,835,518 | 11/1998 | Mundinger et al. ....................... 372/50 |

LASER DIODE PACKAGING

FIELD OF THE INVENTION

The present invention relates generally to lasers diodes and, in particular, to a package for a laser diode that is easy to manufacture and has a low thermal resistance.

BACKGROUND OF THE INVENTION

Semiconductor laser diodes have numerous advantages. They are small in that the widths of their active regions are typically submicron to a few microns and their heights are usually no more than a fraction of a millimeter. The length of their active regions is typically less than about a millimeter. The internal reflective surfaces, which produce emission in one direction, are formed by cleaving the substrate from which the laser diodes are produced and, thus, have high mechanical stability.

High efficiencies are possible with semiconductor laser diodes with some pulsed junction laser diodes having external quantum efficiencies near 50%. Semiconductor lasers produce radiation at wavelengths from about 20 to about 0.7 microns depending on the semiconductor alloy that is used. For example, laser diodes made of gallium arsenide with aluminum doping (AlGaAs) emit radiation at approximately 0.8 microns (~800 nm) which is near the absorption spectrum of common solid state laser rods and slabs made from Neodymium doped, Yttrium-Aluminum Garnet (Nd:YAG), and other crystals and glasses. Thus, semiconductor laser diodes can be used as the optical pumping source for larger, solid state laser systems.

Universal utilization of semiconductor laser diodes has been restricted by thermally related problems. These problems are associated with the large heat dissipation per unit area of the laser diodes which results in elevated junction temperatures and stresses induced by thermal cycling. Laser diode efficiency and the service life of the laser diode is decreased as the operating temperature in the junction increases.

Furthermore, the emitted wavelength of a laser diode is a function of its junction temperature. Thus, when a specific output wavelength is desired, maintaining a constant junction temperature is essential. For example, AlGaAs laser diodes that are used to pump a Nd:YAG rod or slab should emit radiation at about 808 nm since this is the wavelength at which optimum energy absorption exists in the Nd:YAG. But, for every 3.5° C. to 4.0° C. deviation in the junction temperature of the AlGaAs laser diode, the wavelength shifts 1 nm. Accordingly, controlling the junction temperature and, thus, properly dissipating the heat is critical.

When solid state laser rods or slabs are pumped by laser diodes, dissipation of the heat becomes more problematic since it becomes necessary to densely pack a plurality of individual diodes into arrays which generate the required amounts of input power for the larger, solid state laser rod or slab. However, when the packing density of the individual laser diodes is increased, the space available for extraction of heat from the individual laser diodes decreases. This aggravates the problem of heat extraction from the arrays of individual diodes.

One known package which attempts to resolve these thermally-related problems includes the use of a thin, thermally conductive ceramic structure, like beryllium oxide. The ceramic structure includes a plurality of grooves which are cut, etched or sawed therein. A metallized layer extends from groove to groove to conduct electricity therethrough for supplying electrical power to the plurality of laser diodes which are soldered to the metallized layers in the grooves. This type of package is generally disclosed in several U.S. patents to Karpinski including, for example, U.S. Pat. Nos. 5,128,951 and 5,040,187.

However, this known package has several problems. For example, laser diodes typically have an inherent curvature due to the process by which they are made. Placing a curved laser diode in the straight groove of this known package results in additional stress on the laser diode and often an uneven solder bond along the length of the laser diode which can lead to failure. Because the grooves are typically deeper than the laser diodes, it can be difficult to control the location of the emitting surface of the laser diode in this known package. If beryllium oxide is the material used in this package, further problems arise since it is a toxic material and cutting grooves produces airborne dust particles.

SUMMARY OF THE INVENTION

A laser diode assembly includes a laser diode having an emitting surface and a reflective surface opposing the emitting surface. Between the emitting and reflective surfaces, the laser diode has first and second surfaces to which a first heat sink and second heat sink are attached, respectively, via a solder bond.

A spacer element is disposed between the first and second heat sinks. The spacer element is positioned below the laser diode and contacts the reflective surface of the laser diode. The spacer element has a width that is chosen to provide optimum spacing between the first and second heat sinks. Furthermore, the spacer element has a height that is chosen to place the emitting surface of the laser diodes at a position that is substantially flush with the upper surfaces of the heat sinks. Preferably, the spacer element is made of a material that is rigid or at least semi-rigid so that its function in establishing the optimum spacing between the components is not compromised when the heat sinks sandwich the spacer element. The material of the spacer element should also be compatible with the material of the laser diode against which the spacer element is positioned. In one embodiment, the spacer element is made of gallium arsenide, the same fundamental material within the laser diode.

A substrate is positioned below the first and second heat sinks and is attached to these two components usually via a solder bond. The substrate is preferably made of a nonconductive material so that electrical current flows from the first heat sink, into the laser diode and finally into the second heat sink. To properly locate the spacer element, the substrate may include a locating channel into which the spacer element fits.

The components of the laser diode assembly are made integral with each other by one heating step. Each of the heat sinks is coated with a solder layer prior to assembly. Once the components are placed in their basic assembly position, the heating step causes the solder layer on the heat sinks to reflow so that each heat sink attaches to the adjacent laser diodes and to the substrate.

The laser diode assembly can also be produced with each assembly having multiple laser diodes. Again, one heating step is used to make all components integral with each other.

The resulting laser diode assembly can be used for continuous wave (CW) modes of operation or for pulsed modes of operation. In either operational mode, the lower surface of the substrate is attached, usually by soldering, to a thermal reservoir such as a heat exchanger.

The above summary of the present invention is not intended to represent each embodiment, or every aspect, of the present invention. This is the purpose of the figures and the detailed description which follow.

BRIEF DESCRIPTION OF THE DRAWINGS

Other objects and advantages of the invention will become apparent upon reading the following detailed description and upon reference to the drawings in which.

Figure 1:
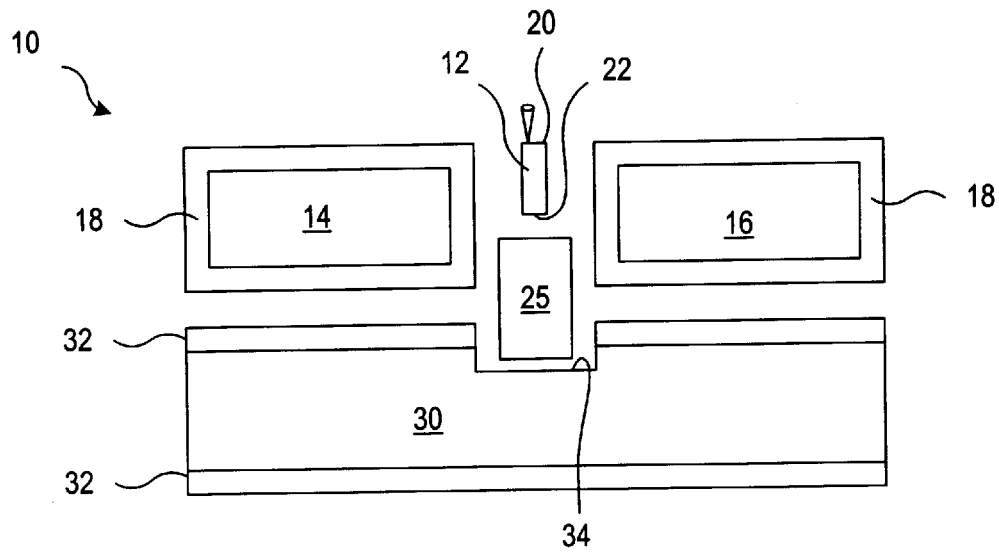
FIG. 1 is an exploded end view of the inventive laser diode assembly which conceptually illustrates its components.

While the invention is susceptible to various modifications and alternative forms, a specific embodiment thereof has been shown by way of example in the drawings and will herein be described in detail. It should be understood, however, that it is not intended to limit the invention to the particular forms disclosed. To the contrary, the intention is to cover all modifications, equivalents, and alternatives falling within the spirit and scope of the invention as defined by the appended claims.

DETAILED DESCRIPTION OF THE INVENTION

Figure 2:
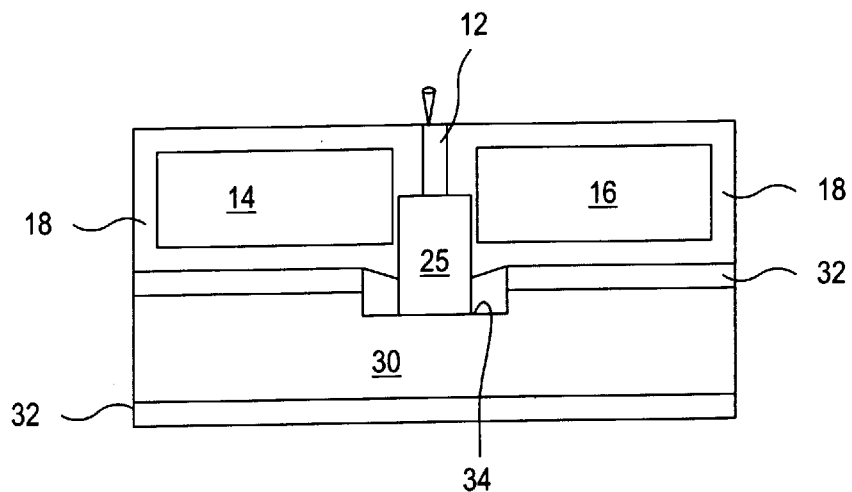
FIG. 2 is an end view of the laser diode assembly of FIG. 1 which conceptually illustrates the components in the final assembly position.

Referring initially to FIGS. 1 and 2, a laser diode assembly 10 is illustrated in an end view. FIG. 1 illustrates the laser diode 10 prior to its final assembly while FIG. 2 illustrates a laser diode assembly 10 in its final assembly. It should be understood, however, that FIGS. 1 and 2 only conceptually illustrate the components of the laser diode assembly 10 and, thus, the dimensions on each of the components, especially the solder and metallization layers which are discussed below, are not proportional. FIGS. 3–6 illustrate views of the laser diode assembly 10 where the dimensions of the components are closer to being proportional.

The laser diode assembly 10 includes a laser diode 12 sandwiched between a left heat sink 14 and a right heat sink 16. The heat sinks 14 and 16 are made of a material that is electrically and thermally conductive, such as copper. Electrical conductivity is needed to conduct the electrical current through the laser diode 12. Thermal conductivity is needed to conduct the intense heat away from the laser diode 12 and maintain the laser diode 12 at a reasonable temperature. Both the left heat sink 14 and right heat sink 16 have a solder layer 18 on their exterior surfaces.

The laser diode 12 has an emitting surface 20 on one end and a reflecting surface 20 opposing the emitting surface 20. The height of the laser diode 12 is defined as the distance between the emitting surface 20 and the reflecting surface 22. The junction of the laser diode 12 where the photons are produced is nearest the left heat sink 14 in the laser diode assembly 10. Electrical power is guided to defined regions of the junction by providing electrically conductive material in the laser diode 12 adjacent those regions and less electrically conductive material outside those regions. Consequently, the laser diode 12 has a plurality of emission points on the emitting surface 20 corresponding to those regions where electrical energy is converted into light energy. When the electrical power is applied, photons propagate though the junction and are reflected off the reflecting surface 22 such that emission only occurs at the emitting surface 20.

Below the laser diode 12 is a spacer element 25. In the final assembly, the spacer element 25 serves the purpose of maintaining the proper spacing between the left heat sink 14 and the right heat sink 16 so that the laser diode 12 is properly embraced between these two structures. The spacer element 25 is preferably made of a rigid or semi-rigid material having a low electrical conductivity and which is compatible with the primary material used to make the laser diode 12 which, in most cases, is gallium arsenide ("GaAs"). In a preferred embodiment, the spacer element 25 is semi-insulating or undoped GaAs.

A substrate 30 is positioned below the left and right heat sinks 14 and 16 and the spacer 25. The substrate 30 is typically made of a material that has a high thermal conductivity, but a low electrical conductivity, such as beryllium oxide ("BeO"). The substrate 30 includes a metallized layer 32 on both of its top and bottom surfaces. Additionally, the substrate 30 includes a locating channel 34 at approximately its center point. The metallized layer 32 on the lower surface of the substrate 30 is present to allow the entire laser diode assembly 10 to be soldered to a thermal reservoir such as a heat exchanger. The metallized layer 32 on the upper surface of the substrate 30 allows the solder layer 18 on the left and right heat sinks 14 and 16 to be attached to the substrate 30. The metallized layer 32 along the upper surface of the substrate 30 is not present in the region of the locating channel 34 to electrically isolate the heat sinks 14 and 16 from each other so electrical current is conducted only through the laser diode 12.

The process by which the laser diode assembly 10 is manufactured is relatively simply and will now be described. First, the left and right heat sinks 14 and 16, which are preferably copper, are dipped into a highly active flux to prepare their exterior surfaces for being coated with the solder layer 18. The flux is preferably an organic flux, such as No. 4 flux manufactured by the Indium Corporation of America of Utica, N.Y., a flux which is commonly known in the art. After the heat sinks 14 and 16 have been dipped into the flux, they are then dipped into molten indium which results in the solder layers 18 that are illustrated on the exterior surface of both the left heat sink 14 and the right heat sink 16 in FIGS. 1 and 2. Next, the end surfaces of the left and right heat sinks 14 and 16 are placed on a hot plate which maintains their temperature above the melting point of indium (~157° C.) so that the excess indium can be blown from the exterior surfaces with air. Alternatively, the left and right heat sinks 14 and 16, once removed from the molten indium, are subjected to a hot air source which has a temperature above the melting point of the indium. This eliminates the need for a hot plate. In either of these alternative processing steps, the flow of air provides a relatively even thickness along the solder layer 18. Preferably, the solder layers 18 have a thickness of about 1–5 mils (about 0.001 inch to about 0.005 inch).

Once the excess indium is blown off with the air, the heat sinks 14 and 16 are dipped into water and into acetone to remove any additional flux that may be present on their exterior surfaces. The heat sinks 14 and 16 are then stored in an environment where oxidation of the indium is prohibited. One example of such an environment is a hexane bath into which the heat sinks 14 and 16 are submerged.

To prepare the substrate 30, a metallization process is employed. For simplicity, the substrate 30 will be referred to hereinafter as a "BeO substrate" 30 since this is one material that the applicants prefer for the laser diode assembly 10. Because the metallized layer 32 on the top of the BeO substrate 30 will be attached to the solder layer 18 on the heat sinks 14 and 16, the material used in the metallized layer 32 must be compatible with the solder layer 18, which in the preferred embodiment is indium. In one embodiment, the metallized layer 32 includes a nickel chromium ("NiCr") layer which is the deposited onto the upper surface of the BeO substrate 30 through a vacuum depositing process such as a sputtering process or physical vapor deposition. The NiCr layer has a thickness of approximately 500 Angstroms. To provide for an optimum adherence between the solder layer 18 and the metallized layer 32, the NiCr layer is then coated with a layer of gold which can range from about 2000–20,000 Angstroms in thickness which makes the overall thickness of the metallized layer 32 substantially less than 1 mil (0.001 inch). Thus, the indium solder layer 18 is attached to the gold on the metallized layer 32. The same process is also used on the metallized layer 32 located on the bottom of the BeO substrate 30.

To develop the locating channel 34, several options are available. In one alternative, the BeO substrate 30, which already has the metallized layer 32 placed on its upper surface, is subjected to an etching process whereby a predetermined thickness of material is etched away to develop the locating channel 34. Alternatively, a mechanical process can be employed which cuts into the metallized layer 32 and BeO substrate 30 to produce the locating channel 34.

In another alternative that produces the locating channel 34, the metallized layer 32 located on the BeO substrate 30 is attached to the BeO substrate 30 through the vacuum depositing process described above. However, a mask is placed at the position on the BeO substrate 30 where the locating channel 34 is desired. The mask prohibits the metallization layer 32 from attaching to the BeO substrate 30 below it. The locating channel 34 would be defined by the upper surface of the BeO substrate 30 and the thickness of the metallized layer 32. In other words, no etching or mechanical processes would be needed to developed the locating channel 34, but instead the mere thickness of the metallized layer 32 would provide the locating channel 34. Removal of the cutting or etching step is especially beneficial when the substrate 30 is made of a hazardous material like BeO. Since the locating channel 34 would be relatively shallow, the assembler of the laser diode assembly 10 would rely on locating the spacer element 25 on the locating channel 34 by sight as opposed to by feel.

Figure 2A:
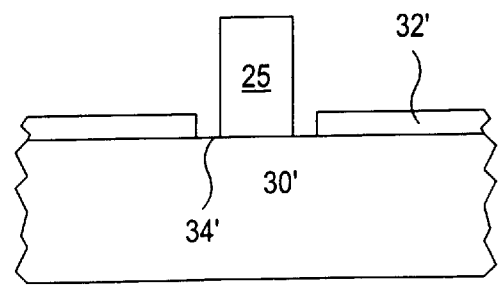
FIG. 2A is an alternative substrate structure which produces the locating channel.
Figure 5:
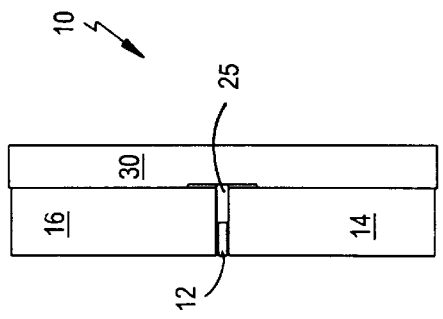
FIG. 5 is an end view of the laser diode assembly.
Figure 4:
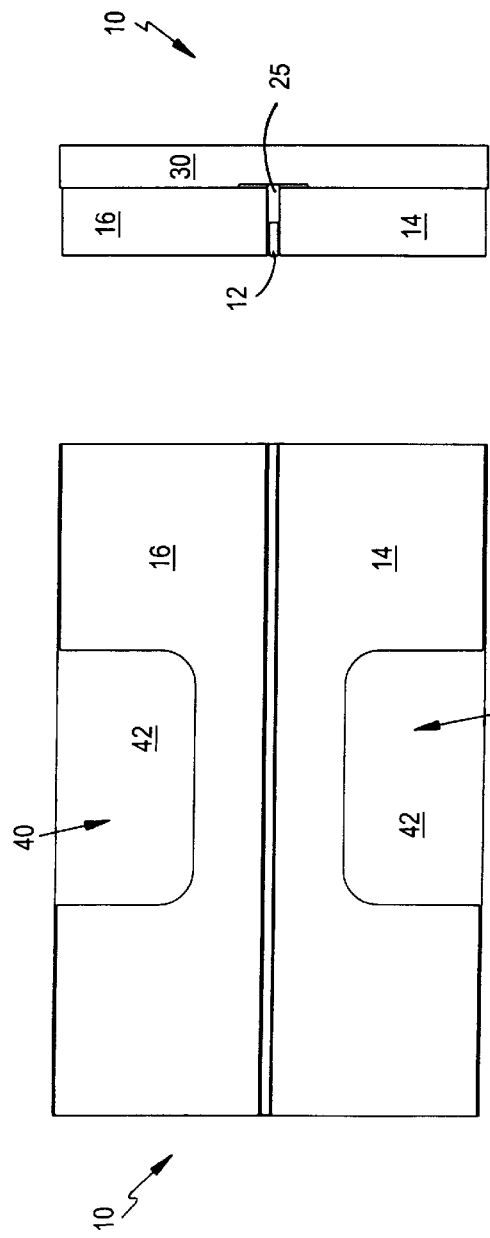
FIG. 4 is a top view of the laser diode assembly.
Figure 3:
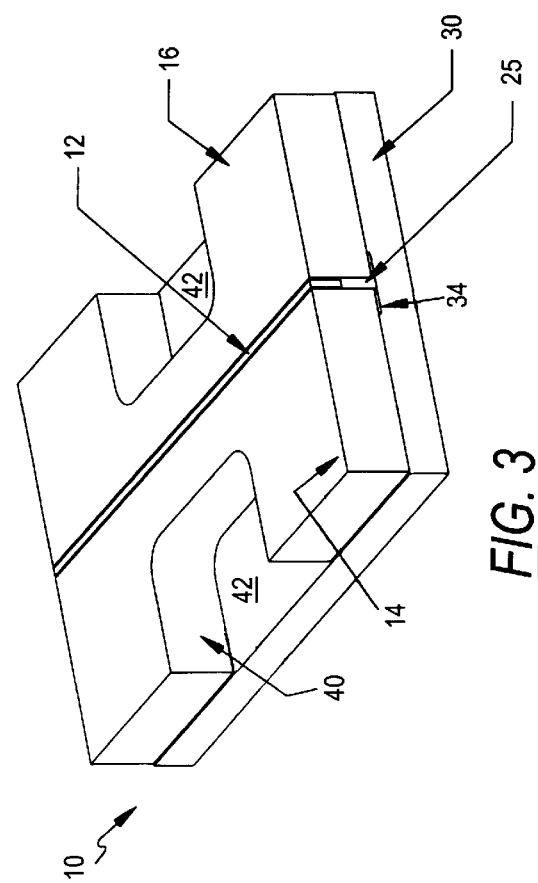
FIG. 3 is an isometric view of the laser diode assembly.
Figure 6:
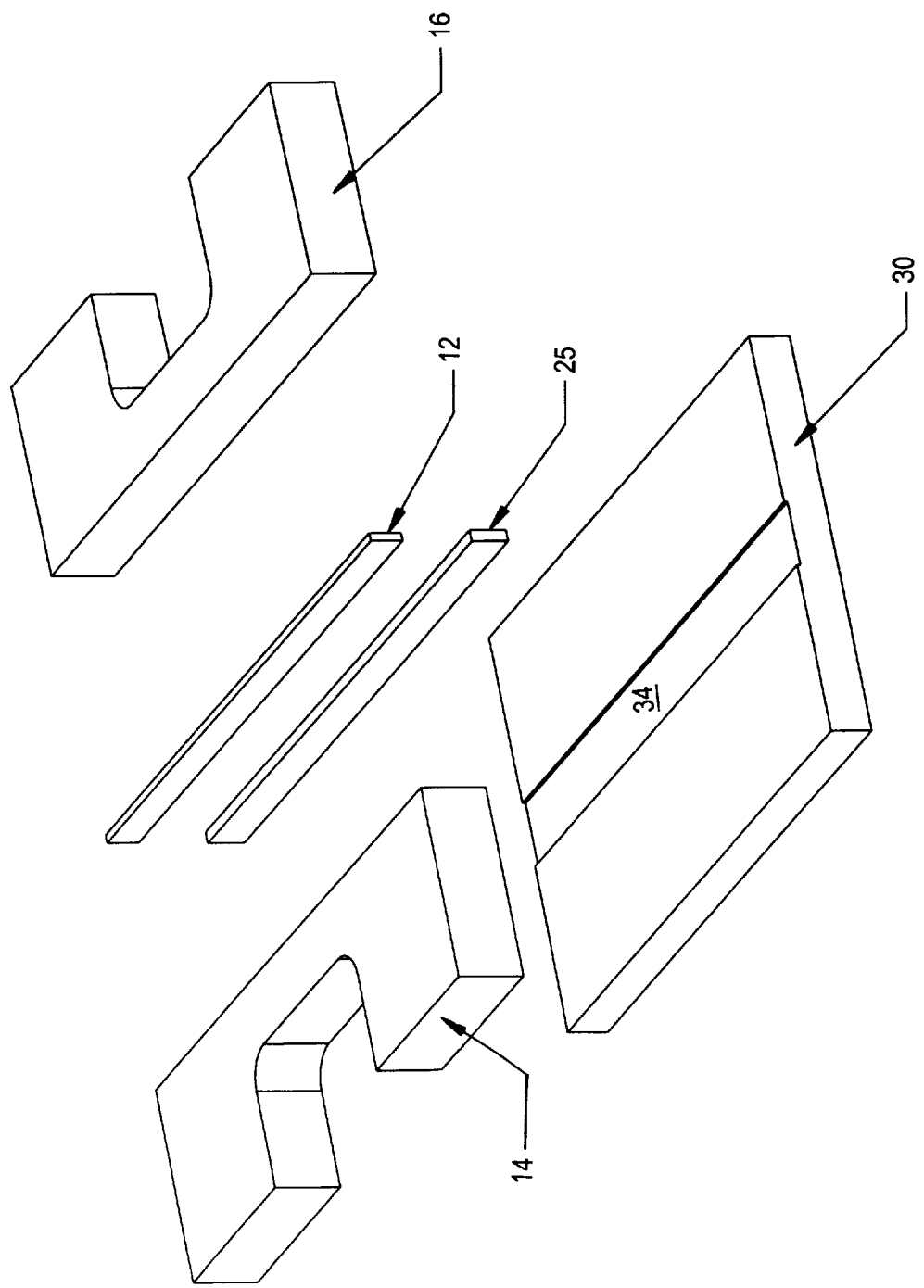
FIG. 6 is an exploded isometric view of the laser diode assembly of FIGS. 3–5.
Figure 7:
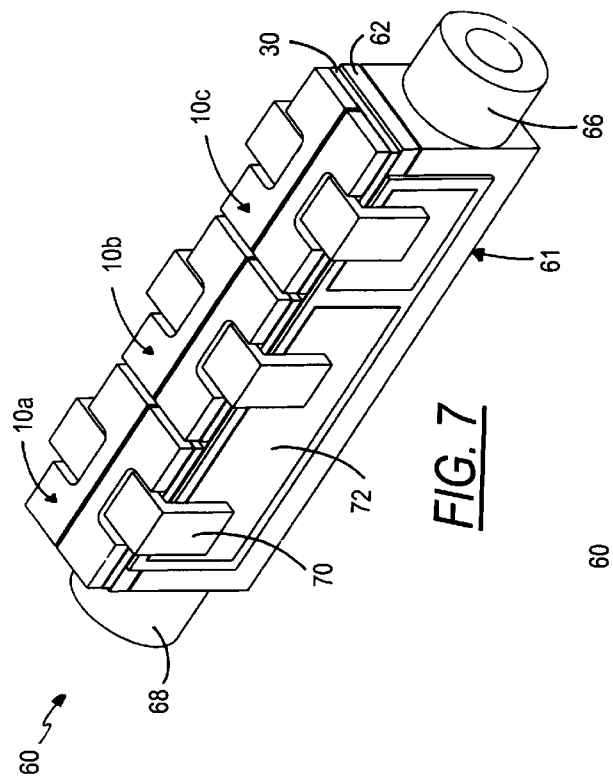
FIG. 7 is an isometric view of a laser head assembly having three laser diode assemblies as shown in FIGS. 1–6.

Alternatively, while the metallization layer 32 described in FIGS. 1–2 is very thin, it may be more beneficial to utilize a thicker metallization layer 32 (e.g. 0.002 inch) on the BeO substrate 30' to better define the locating channel 34' as shown in FIG. 2A. This option is beneficial in that it provides a deep locating channel 34' while removing the cutting or etching step required to develop the deep locating channel 34.

Once the heat sinks 14 and 16 have received their respective solder layers 18 and the BeO substrate 30 has received its metallized layers 32, there are five components that require assembly: the left heat sink 14, the right heat sink 16, the laser diode 12, the spacer element 25, and the BeO substrate 30. To assemble the laser diode assembly 10, the left and right heat sinks 14 and 16 are placed on either side of the locating channel 34 on the BeO substrate 30. The spacer element 25 is then placed between the heat sinks 14 and 16 and is properly located on the BeO substrate 30 by the "locating" channel 34. The heat sinks 14 and 16 are moved towards each other so as to sandwich the spacer element 25. The laser diode 12 is placed between the heat sinks 14 and 16 such that its lower reflective surface 22 engages the upper surface of the spacer element 25. The entire laser diode assembly 10 is subjected to a rosin-activated flux ("RA flux") which assists in adhering the solder to the component surfaces. The assembly 10 is then heated to a point which is above the melting point of indium (~157° C). The heating step is accomplished by placing the lower surface of the BeO substrate 30 on a heated assembly structure or a hot plate. The heat sinks 14 and 16 are again moved towards each other such that their copper exterior surfaces become close to contacting the spacer element 25 as is shown in FIG. 2. Typically, there will be at least a thin coating of solder between the spacer element 25 and the copper exterior surfaces of the heat sinks 14 and 16.

By heating the entire assembly to above the melting point of indium, the solder layer 18 on each of the heat sinks 14 and 16 begins to reflow and attaches to the metallized layer 32 located on the top surface of the BeO substrate 30. Additionally, the solder along the side surfaces of the heat sinks 14 and 16 which face the laser diode 12 begins to reflow and attaches to the exterior side surfaces of the laser diode 12. Because the solder layer 18 that is directly adjacent to the upper edges of the spacer element 25 begins to reflow, the heat sinks 14 and 16 can move closer to the laser diode 12. The solder layer 18 which reflows from that area directly adjacent to the spacer element 25 can flow upwardly to assist in attaching the laser diode 12 to the heat sinks 14 and 16 or may flow downwardly into the locating channel 34. If this solder flow that occurs adjacent to the spacer element 25 is in the downward direction towards the locating channel 34 (see FIG. 2), there is not enough solder material 18 to produce an electrical path through the indium below the spacer element 25. When the solder flows upwardly, the coatings on the emitting surface 20 of the laser diode 12 tend to repel the flow of solder in that direction. Instead, the path of least resistance for this liquid solder flow is along the heat sinks 14 and 16 away from the emitting surface 20. When GaAs is used as the material for the spacer element 25, the solder generally does not adhere to the surface of the GaAs. While pure indium is the preferred material for the solder layers 18, other common solders that could be used at the solder layers 18 include various alloys having indium such as indium gallium alloys, indium tin alloys, and indium gallium tin alloys.

Once the heat which causes the reflow of the solder layer 18 is removed, the solder layer 18 again solidifies such that where the entire assembly is one integral unit as is shown in FIG. 2. The laser diode assembly 10 is then cleaned by emersion in a heated acetone bath after which the laser diode assembly 10 is stored in a low humidity environment (e.g. a desiccant cabinet or a dry box).

To create optical energy, electrical current must be conducted through the laser diode 12. When viewing the laser diode assembly 10 from left to right, the electrical current flows from the left heat sink 14, into the laser diode 12, and into the right heat sink 16. There is no electrical path below the laser diode 12 due to locating channel 34 breaking the metallization layer 32. The spacer element 25 also assists in providing electrical isolation between the heat sinks 14 and 16. It is this electrical current through the laser diode 12 that produces the optical energy from the laser diode assembly 10.

It should be noted that due to the manufacturing process by which the laser diode 12 is produced, the laser diode 12 inherently includes some curvature along its length (i.e. into the paper as shown in FIGS. 1 and 2). This inherent curvature is brought about by the depositing of several layers of material on a substrate from which the laser diode 12 is manufactured. The layers, which include materials having various coefficients of thermal expansion, are deposited at elevated temperatures. Once the layers have cooled and the substrate is cut, or cleaved, to produce the individual diode bars 12, the mismatch of coefficients of thermal expansion leads to the bending, or bowing, of the individual laser diodes 12.

Because of this inherent curvature, the distance from the left exterior surface of the laser diode 12 to the right surface of the left heat sink 14 will vary as a function of the length of laser diode 12. Similarly, the distance between the right exterior surface of the laser diode 12 and the left surface of the right heat sink 16 will vary as a function of the length of the laser diode 12. This resulting gap between the laser diode 12 and the heat sinks 14 and 16, which varies in size, is filled with the appropriate thickness of indium solder layer 18 such that contact with the heat sinks 14 and 16 is established along the entire length of the laser diode 12. In other words, the process by which the laser diode assembly 10 is assembled tends to provide a constant electrical contact along the entire length of the laser diode 12 even though the laser diode 12 has an inherent curvature which could normally produce voids in the solder contact. Furthermore, it should be noted that even if voids appear adjacent to the laser diode 12 after the assembly process, additional solder can be added to fill in these voids to maintain the appropriate electrical and thermal contact along the entire length of the laser diode 12.

The spacer element 25 establishes the lateral spacing of the left and right heat sinks 14 and 16 and also provides for the exact location of the emitting surface 20 relative to the upper surfaces of the heat sinks 14 and 16. The spacer element 25 is manufactured such that its lateral and vertical dimensions are held to a tight tolerance. For example, if the spacer element 25 is made of undoped gallium arsenide (GaAs), it can be cleaved such that its dimensional tolerances are held to ±2–3 microns ($\mu$m). Thus, the distance between the left and right heat sinks 14 and 16 and the location of the emitting surface 20 of the laser diode 12 can be precisely controlled. Consequently, the spacer element 25 can be viewed as a precision spacer element that accurately locates the lateral and vertical position of the laser diode 12 relative to the left and right heat sinks 14 and 16.

The BeO substrate 30 has a height that is approximately 0.025 inch and a width (as shown in FIGS. 1 and 2) of about 0.25 inch. The length of the BeO substrate 30 (i.e. into the paper) is substantially the length of the laser diode 12 which is usually about 0.4 inch. Considering that the metallization layers 32 add less than 0.001 inch to the overall height of the BeO substrate 30, it is difficult to visualize the thickness of the metallization layers 32 on the BeO substrate 30 with the naked eye. The locating channel 34 preferably has a depth of about 2 mils (0.002 inch) and a width of about 40 mils (0.040 inch).

While the substrate 30 is preferably made of BeO, the substrate 30 may be made of other non-metallic materials, such as diamond, boron nitride, or aluminum nitride, which have a high thermal conductivity. In an alternative embodiment, the substrate 30 can be electrically and thermally conductive (e.g. copper) as long as adequate protection is made to electrically insulate the heat sinks 14 from each other and the substrate 30. This can be accomplished by coating the substrate 30 with an electrically insulating material, such as silicon oxide, prior to applying the metallization layer 32 on the upper surface.

Each heat sink 14 and 16 has a width of about 0.12 inch and a length of about 0.4 inch. The height of each heat sink 14 and 16 is about 45 mils (0.045 inch) before being dipped in the molten solder that produces the solder layer 18. After being dipped, the height is about 50 mils (0.050 inch).

The laser diode 12 has a width of approximately 5 mils (0.005 inch) while the spacer element 25 has a width of about 7 mils (0.007 inch). The height of the laser diode 12 is usually about 20–25 mils (0.020 inch to 0.025 inch). The height of the spacer element 25 is chosen such that the emitting surface 20 is substantially flush with the upper surfaces of the heat sinks 14 and 16. Thus, usually a variety of heights for the spacer element 25 are available with the heights usually ranging from about 0.015 inch to about 0.025 inch. This range accounts for the manufacturing tolerance variations in the depth of the locating channel 34, the height of the heat sinks 14 and 16, and the thickness of the solder layers 18.

During the assembly process, the individual who is assembling the laser diode assembly 10 can determine whether the emitting surface 20 of the laser diode 12 extends too far above or too far below the upper surfaces of the heat sinks 14 and 16. If the emitting surface 20 is located too far above the heat sinks 14 and 16, there is no place for the heat produced on the upper portion of the laser diode 12 adjacent to the emitting surface 20 to be conducted which is one of the primary purposes of the heat sinks 14 and 16. If this is the case, then it is likely that the laser diode 12 will catastrophically fail due to an extreme temperature condition. On the other hand, if the emitting surface 20 of the laser diode 12 is positioned too far below the upper surfaces of the heat sinks 14 and 16, then the output energy of the laser diode 12 may be reduced due to the fact that the side surfaces of the heat sinks 14 and 16 facing the laser diode 12 will absorb or downwardly reflect the emitting energy which causes a reduction in the output of laser diode 12. Consequently, it is preferred that the emitting surface 20 be positioned substantially flush (i.e. substantially coplanar) with the upper surfaces of the heat sinks 14 and 16. In the preferred embodiment, the emitting surface 20 is positioned within about 1 mil (i.e. ±0.001 inch) of the upper surfaces of the heat sinks 14 and 16.

If the spacer element 25 does not place the emitting surface 20 at the correct position, the assembler can choose a different sized spacer element 25 that provides additional or less height to place the emitting surface 20 of the laser diode 12 at a position that is substantially flush with the upper surfaces of the heat sinks 14 and 16. The process by which the assembler removes the spacer element 25 and inserts a new spacer 25 with a different height can occur prior to the reflowing of the indium solder layer 18 or while the indium solder layer 18 is in a molten state. At either stage, the spacer element which has the incorrect height is pushed outwardly (i.e. into the paper as shown in FIGS. 1 and 2) so that it can be grasped on the other end of the laser diode assembly 10. Prior to fully removing the old spacer element from the assembly 10, the new spacer element 25 is reinserted from the opposing side and moved inwardly into the laser diode assembly 10. The movement of the new spacer element 25 pushes the old spacer element out of the laser diode assembly 10. Consequently, the position of the emitting surface 20 is adjusted while the laser diode 12 is between the heat sinks 14 and 16.

Preferably, the assembler of the laser diode assembly 10 would have various bins of spacer elements 25 from which to choose with each bin representing a specific height for the spacer element 25. As stated previously, because the preferred material for the spacer element 25 is gallium arsenide the cleaving process that produces the spacer element 25 produces extremely accurate heights such that the height differential between the spacer elements 25 in the bins may be, for example, 1 mil (0.001 inch).

While the spacer element 25 has been described as being GaAs, it could also be made of other electrically non-conductive materials. For example, the spacer element could be a rigid or semi-rigid polymer (such as nylon), silicon, or a glass fiber. Each of these materials could be placed between the heat sinks 14 and 16 and engage the reflective surface 22 of the laser diode 12 so as to register the emitting surface 20 substantially flush with the upper surfaces of the heat sinks 14 and 16. In an alternative embodiment, the spacer element 25 would simply be for registering the emitting surface 22 with the upper surfaces of the heat sinks 14 and 16 and could be removed from the assembly altering the registering step and soldering steps. Or, the spacer element 25 may remain within the assembly 10, but not contact the substrate 30.

While FIGS. 1 and 2 conceptually illustrate the laser diode assembly 10 including the solder layers 18 and the metallization layers 32, FIGS. 3–6 illustrate various views of the laser diode assembly 10 according to the present invention where the relative dimensions of the components are more accurate. Because the solder layers 18 and the metallization layers 32 are very thin relative to the dimensions of other components, the solder layers 18 and metallization layers 32 are not shown in FIGS. 3–6. However, it should be understood that the solder layers 18 on the heat sinks 14 and 16 and the metallization layers 32 on the substrate 30 are present in FIGS. 3–6.

Each of the heat sinks 14 and 16 includes a recess 40 which exposes the upper surface of the substrate 30. Because the upper surface of the substrate includes the metallization layer 32 (FIGS. 1 and 2), the upper surface which is accessible through the recess 40 has this metallization layer 32 (FIGS. 1 and 2) present thereon. Consequently, the recess 40 defines a contact region 42 for an electrical wire or contact which provides the necessary electrical current to the laser diode assembly 10. Thus, the electrical current flows from the contact wire into the metallization layer 32 at the contact region 42, through the left heat sink 14, into the laser diode 12, and finally into the right heat sink 16 and the metallization layer at its contact region 42.

Referring now to FIGS. 7–10, a laser head assembly 60 is illustrated which includes three laser diode assemblies 10a, 10b and 10c, each of which includes one laser diode 12. Thus, the laser head assembly 60 includes three laser diodes 12. The laser head assembly 60 includes a heat exchanger 61 which has an upper flange 62. The substrate 30 of each of the laser diode assemblies 10a, 10b and 10c is attached to the flange 62 of the heat exchanger 61. To minimize the thermal resistance between each of the laser diode assemblies 10a, 10b and 10c and the flange 62, the substrate 30 is preferably soldered to the flange 62. The metallization layer 32 located on the bottom of the substrate 30 (FIGS. 1 and 2) provides an adequate surface for soldering. The flange 62 of the heat exchanger 61 has cooling fins 64 (FIG. 10) attached thereto through which a fluid, such as water, flows to provide the necessary cooling for the laser diode assemblies 10a, 10b and 10c. The fluid enters the heat exchanger 61 through an inlet 66 and exits through an outlet 68. It should be noted that the flange 62 of the heat exchanger 61 could be configured like the non-conductive substrate 30 so that the heat sinks 14 could be attached to the flange 62 which eliminates the need for the substrate 30 and results in an assembly having a minimal thermal resistance between the laser diode 12 and the thermal reservoir.

As previously mentioned with respect to FIGS. 3–6, each of the laser diode assemblies 10a, 10b and 10c has two recesses 40 (FIGS. 3 and 4) onto which a contact 70 can be electrically attached. The contact 70, shown in FIGS. 7–10, has a horizontal portion for contacting the contact region 42 (FIGS. 3 and 4) and a vertical segment which is electrically connected to an isolated conducting surface 72 located on the side of the heat exchanger 61.

Figure 10:
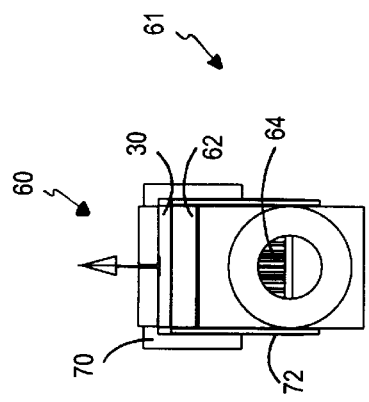
FIG. 10 is an end view of the laser head assembly of FIG. 7.
Figure 8:
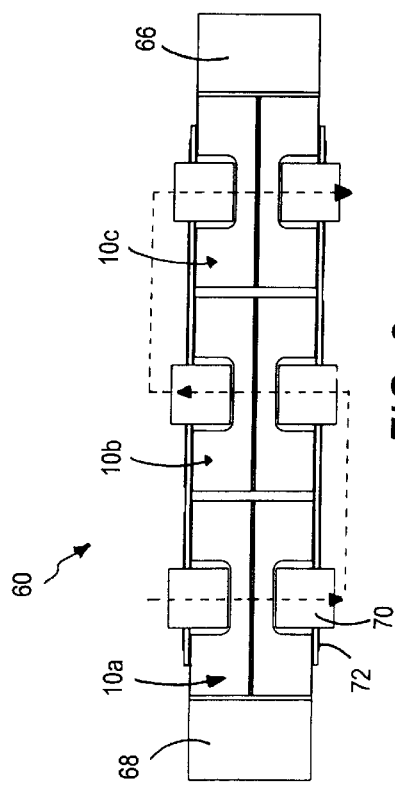
FIG. 8 is a top view of the laser head assembly of FIG. 7.
Figure 9:
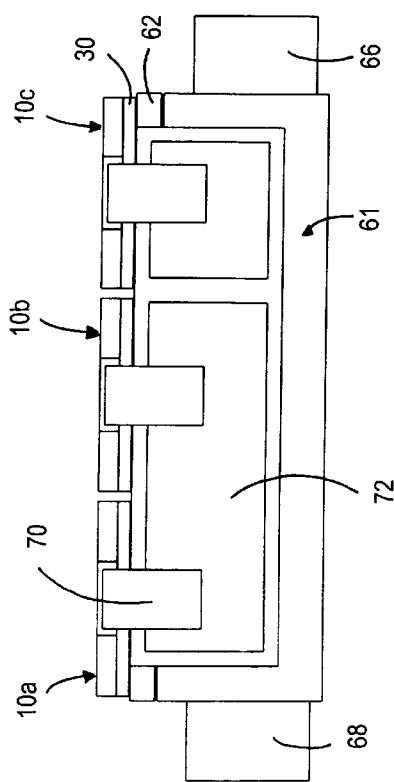
FIG. 9 is a side view of the laser head assembly of FIG. 7.

FIG. 8 illustrates the path of the electrical current in dashed lines. The electrical current enters the first laser diode assembly 10a and passes therethrough before moving through the contact 70 to the conducting surface 72. The current then passes through the middle laser diode assembly 10b and then is conducted through a conducting surface (not numbered) on the back side of the heat exchanger 61 to the third laser diode assembly 10c. Finally, the current passes through the third laser diode assembly 10c. The resulting laser emission, as shown in FIG. 10, is perpendicular to the plane to the upper surfaces of laser diode assemblies 10a, 10b and 10c.

Because the energy emitted from each of the laser diode assemblies 10a, 10b and 10c is generally colinear, the laser head assembly 60 can be used as the pumping source for a solid state laser rod or slab (e.g. Nd:YAG). If the solid state laser is in the form of a rod, then several laser head assemblies 60 can be circumferentially positioned around the rod to provide the pump energy needed for an output from the laser rod. The laser diode assemblies 10a, 10b and 10c can be used in a continuous wave (CW) mode whereby energy is emitted continuously. Alternatively, the laser diode assemblies 10a, 10b and 10c can be pulsed such that the emitting laser emissions from the laser diode assemblies 10a, 10b and 10c occur for a predetermined duration of time and at a predetermined frequency.

Figure 11:
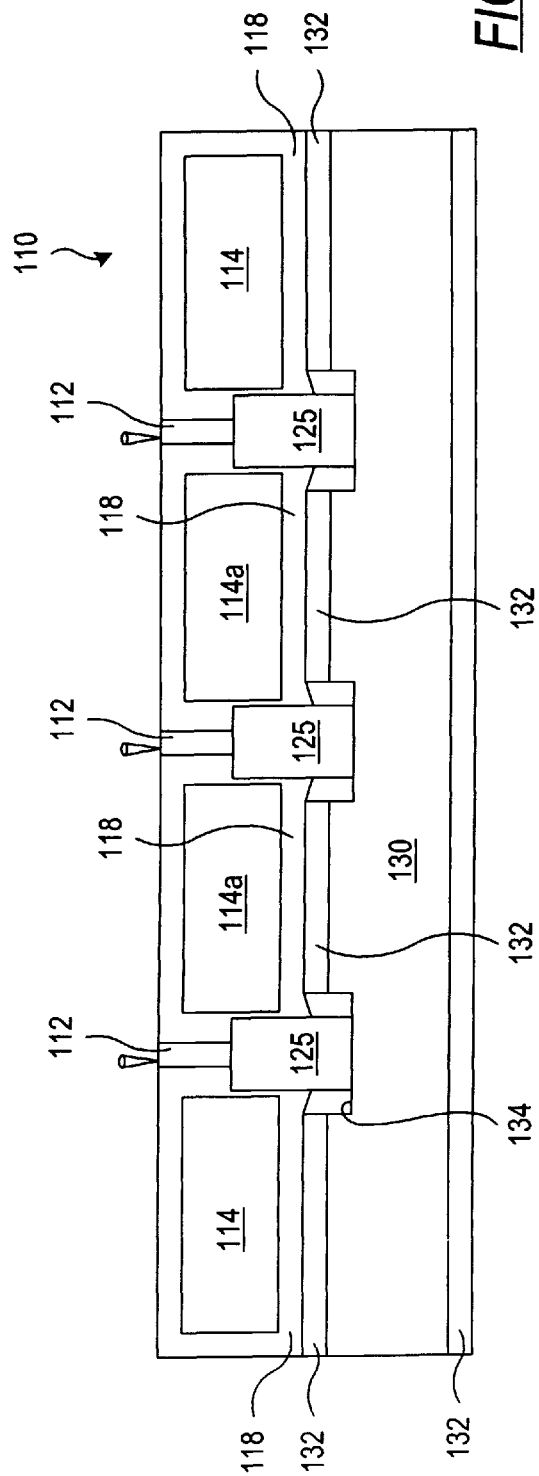
FIG. 11 is an end view which conceptually illustrates a laser diode assembly having multiple laser diodes.

In FIG. 11, a laser diode assembly 110 is illustrated which has three laser diodes 112 producing output energy. Each of the three laser diodes 112 in FIG. 11 are sandwiched between two heat sinks 114. Like the heat sinks mentioned with respect to FIGS. 1–10, the heat sinks 114 are preferably made of a material that has a high electrical conductivity and a high thermal conductivity such as copper. These heat sinks 114 are also dipped into a solder, such as a indium solder, to produce a solder layer 118 on their exterior surfaces. The middle two heat sinks 114a, however, do not require the recess (see recess 40 in FIGS. 3 and 4) for providing the contact region. The two end heat sinks 114 have the recess that provides the contact region.

A spacer element 125, preferably made of gallium arsenide, is located below each of the laser diodes 112. The spacer element 125 serves the purpose of providing the appropriate spacing between each of the heat sinks 114 and also to place the emitting surface of each of the laser diodes 112 substantially flush with the upper surfaces of the heat sinks 114. In other words, spacer element 125 is no different than the spacer 25 element discussed with reference to FIGS. 1–10.

A substrate 130, preferably a BeO substrate, is positioned at the lower end of the laser diode assembly 110. The BeO substrate 130 includes metallization layers 132 on its upper and lower surfaces. The metallization layer 132 on the lower surface of the BeO substrate 130 is for providing a surface to which a heat exchanger can be soldered, as was discussed with reference to FIGS. 7–10. The upper metallization layer 132 on the BeO substrate 130 is for attaching the BeO substrate 130 to each of the heat sinks 114. This attachment occurs through the reflow of the solder layer 118 when the entire laser diode assembly 110 is heated during the assembly process. Additionally, the BeO substrate 130 has three locating channels 134, each of which is for a corresponding spacer element 125.

To assemble the laser diode assembly 110, the heat sinks 114 are first coated with the solder layer 118 and the metallized layers 132 are placed on the BeO substrate 130. The BeO substrate 130 also has its locating channels 134 produced therein to accommodate the spacer elements 125. Once these preliminary processes are accomplished, the heat sinks 114 are placed onto the BeO substrate 130. The spacer elements 125 are then deposited between adjacent heat sinks 114 such that the spacer elements 125 come to rest within the locating channels 134. The laser diodes 112 are then placed between the heat sinks 114 and contact the spacer elements 125. Once this fundamental arrangement has been established, the entire assembly is then subjected to a heating step whereby the temperature of the assembly is brought above the melting point of the solder layer 118 which, in the case of indium, is 157° C. As the solder layer 118 begins to reflow, it attaches the heat sinks 114 to the BeO substrate 130. The solder layer 118 also attaches to the side surfaces of the laser diodes 112. In other words, the process in which the laser diode assembly 110 is assembled is fundamentally no different than the process described with reference to the laser diode assembly of FIGS. 1–6.

The resulting laser diode assembly 110 is useful for providing a continuous (CW) mode output wherein the laser diodes 112 are continuously emitting energy. Alternatively, the laser diode assembly 110 can be operated in a pulsed mode whereby the laser diodes 112 emit energy for a predetermined duration of time and at a predetermined frequency. It should be noted that due to the configuration of the laser diode assembly 110, the electrical current passes through the heat sinks 114 and laser diodes 112 from left to right.

Figure 12:
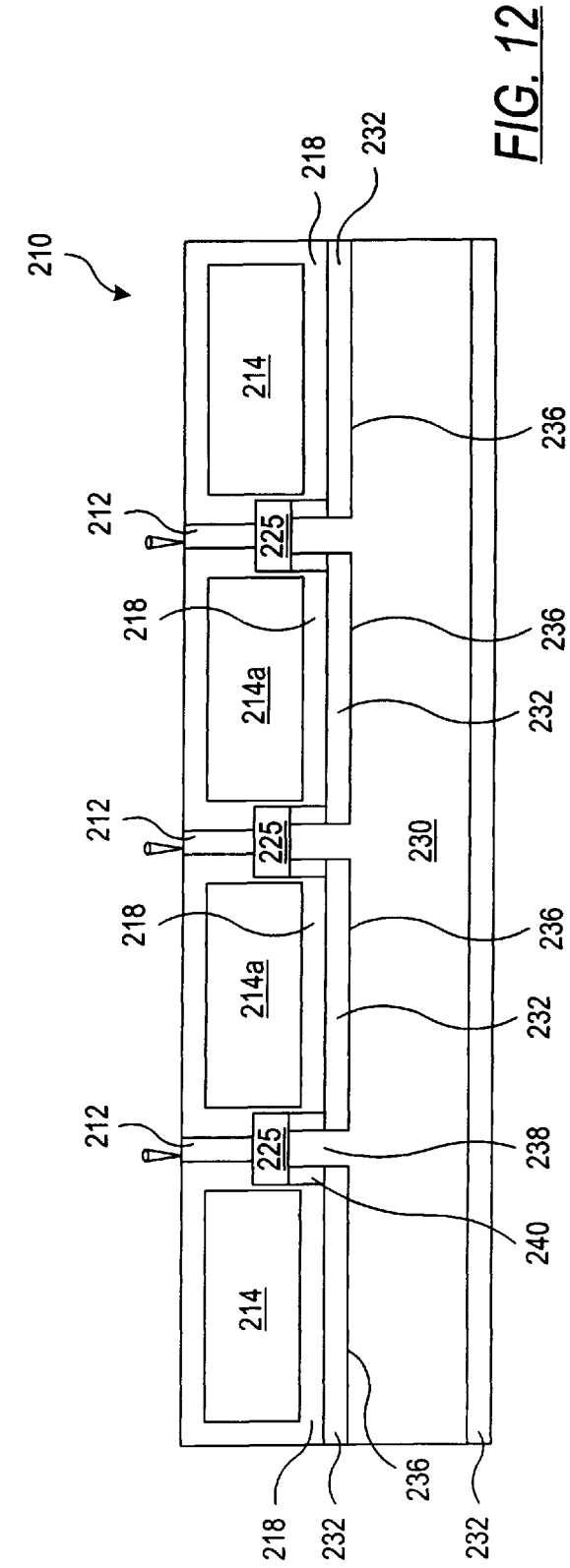
FIG. 12 is an end view which conceptually illustrates an alternative embodiment of a laser diode assembly having multiple laser diodes.

FIG. 12 illustrates an alternative embodiment for a laser diode assembly 210 which contains multiple laser diodes 212. The fundamental difference between the laser diode assembly 210 and the previously discussed laser assemblies lies within the relative positioning of the heat sinks and spacer elements in the locating channels.

Each of the laser diodes 212 is sandwiched between two heat sinks 214. And again, each of the heat sinks 214 has a solder layer 218 on its exterior surface. A spacer element 225 is positioned between two adjacent heat sinks 214 and below the laser diodes 212. As was the case in the previous laser diode assemblies that were discussed, the spacer element 225 serves the purpose of keeping the appropriate distance between adjacent heat sinks 214 and ensuring that the emitting surface of the laser diodes 212 are substantially flush with the upper surfaces of the heat sinks 214.

A substrate 230, preferably a BeO substrate, is located at the bottom of the laser diode assembly 210. The BeO substrate 230 includes a metallization layer 232 on its lower surface and a metallization layer 232 on its upper surface. The BeO substrate 230 has four elongated locating channels 236. Adjacent ones of the elongated locating channels 236 are separated by a pedestal 238 on the BeO substrate 230. The elongated locating channels 236 are for locating the heat sinks 214 on the BeO substrate 230. This is different than in the previously discussed laser diode assemblies where the locating channels were for "locating" the spacer elements.

To assemble the laser diode assembly 210, the heat sinks 214 are placed in their corresponding elongated locating channels 236. Next, the spacer elements 225 are placed between adjacent heat sinks 214 and rest on the upper surface of the pedestals 238. The laser diode 212 is placed between the heat sinks 214 above the spacer element 225. Again, the entire laser diode assembly 210 is heated such that the heat sinks 214 become attached to the BeO substrate 230 through a soldering joint produced by the soldering layer 218. As is shown in FIG. 12, there may initially be a gap 240 which is below the spacer element 225 and to the side of each of the pedestals 238. However, during the reflow process, this gap 240 may be filled with some additional solder from the solder layer 218. The soldering layer 218 on the heat sinks 214 attaches to the side surfaces of the laser diodes 212. It should also be noted that the two central heat sinks 214a do not require a recess to produce a contact region, only the two outer heat sinks 214 would include the recesses (see recess 40 in FIGS. 3 and 4).

As was discussed previously, it is imperative that there is electrical isolation between adjacent heat sinks 214 such that the electrical current is forced through the laser diodes 212. The BeO substrate 230 is coated with a metallization layer 232 on its upper surface to provide a surface to which the solder will adhere. This is performed after the elongated locating channels 236 have been cut or etched into the BeO substrate 230. Thus, the metallization layer 232 is initially present on the upper surfaces of the pedestals 238. However, a second process is employed in which the metallization layer 232 is stripped from the upper surfaces of the pedestals 238 to ensure that there is no flow of current below the spacer element 225. Thus, electrical current only flows above the spacer element 225 through the laser diode 212.

Figure 13:
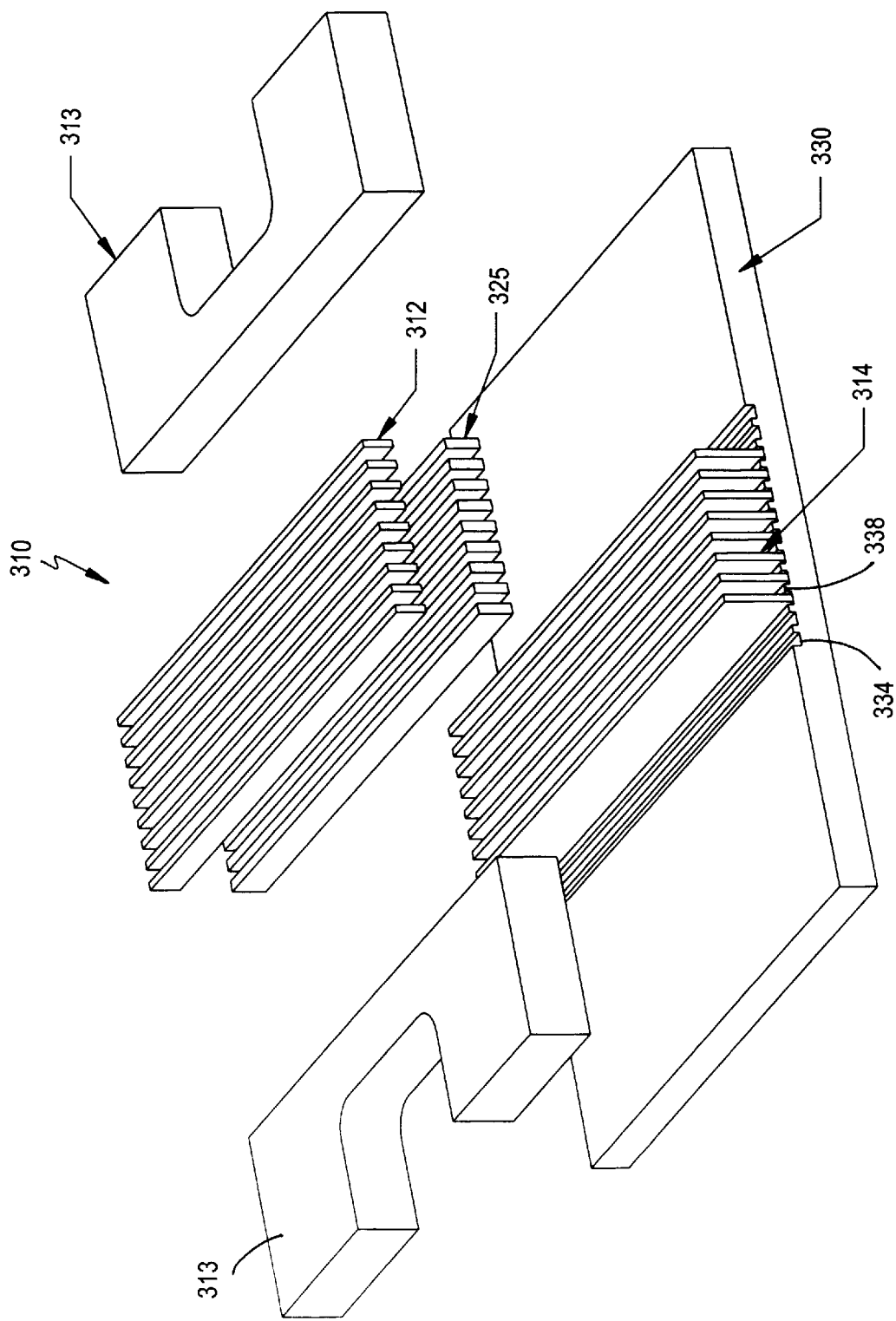
FIG. 13 is an exploded isometric view of an alternative embodiment of a laser diode assembly having multiple laser diode which provide pulsed output energy.
Figure 14:
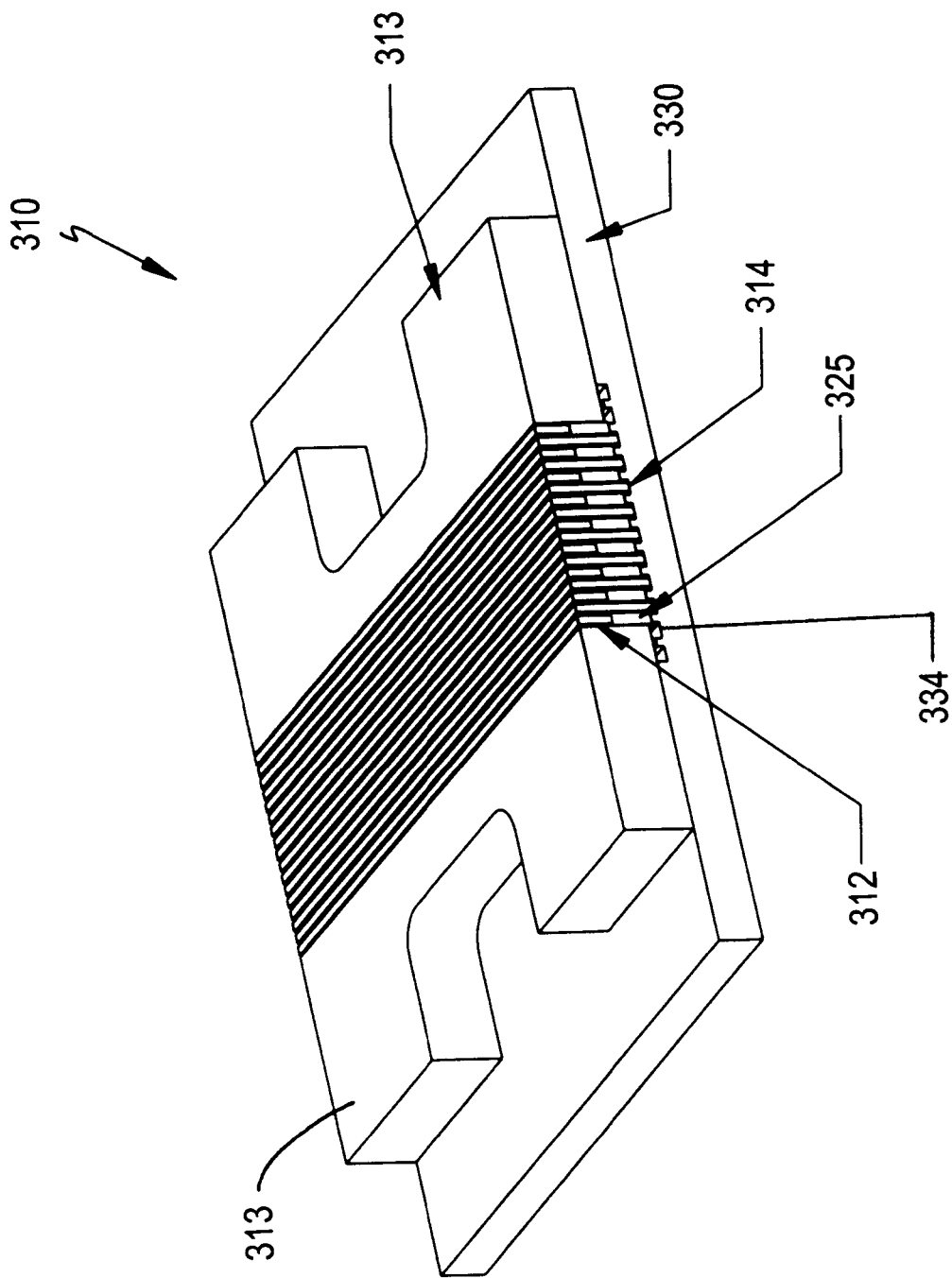
FIG. 14 is an isometric view of the final assembly of the laser diode assembly of FIG. 13.

In FIGS. 13 and 14, an alternative diode assembly 310 is illustrated in an exploded isometric view and also in an isometric view illustrating the final assembly. The laser diode assembly 310 includes a plurality of laser diodes 312 which produce optical energy when electrical energy is applied thereto. As was the case in the previous assemblies that have been described, laser diodes 312 are placed between heat sinks 314 which have a solder layer (not shown) on their exterior surfaces. However, unlike the previous heat sinks described, the heat sinks 314 in FIGS. 13 and 14 are relatively thin with their thickness being less than approximately two times the thickness of the laser diodes 312. The laser diodes 312 at each end of the assembly 310 are sandwiched between a thin heat sink 314 and an end block 313 which resembles the heat sinks that have been previously discussed in FIGS. 1–6. These end blocks 313 include a recess into which a contact wire or contact structure can be placed which provides an input and an output for the electrical current that is conducted through the laser diodes 312.

Between each of the heat sinks 314 is a spacer element 325, which is again preferably made of undoped or semi-insulative GaAs. The laser diodes 312 rest on a corresponding spacer element 325 before the final heating process which produces the integral laser diode assembly 310.

A substrate 330, which is preferably of BeO, is positioned at the bottom of the diode laser assembly 310. The BeO substrate 330 includes a plurality of locating channels 334. While not shown, the BeO substrate 330 is coated with a metallization layer on both its upper and lower surfaces prior to assembly. As was the case in the configuration illustrated in FIG. 12, the upper surface of the pedestals 338 are subjected to a process whereby that metallization layer is removed therefrom. This ensures that there is electrical isolation below the laser diodes 312.

To assemble the laser diode assembly 310, the heat sinks 314 are placed into the locating channels 334. The end blocks 313 are then placed adjacent to the end ones of the heat sinks 314. Next, the spacer elements 325 are placed between adjacent ones of the heat sinks 314 and rest against the upper surface of the pedestals 338. Then, the laser diodes 312 are placed between the heat sinks 314 such that they come to rest and contact the upper surfaces of spacer elements 325. Once the basic configuration of the assembly has been established, the entire assembly 310 is subjected to a heating step whereby the temperature of the laser diode assembly 310 is brought above the melting point of the solder layer that is present on the heat sinks 314 and end blocks 313. The solder layer begins to reflow such that the heat sinks 314 become attached to the BeO substrate 330 and also to the side surfaces of the laser diodes 312. Once the heating step has ended, the molten solder layers on the heat sinks 314 and the end blocks 313 solidify so as to attach the heat sinks 314 and end blocks 313 to the BeO substrate 330 and the adjacent laser diodes 312.

FIGS. 13 and 14 illustrate additional unused locating channels 334. Thus, the substrate 330 can be configured with the maximum number of locating channels 334 that could be used, and a lesser number of laser diodes 312 and, thus, heat sinks 314 (i.e. the number required for a particular application) can be inserted into the substrate 330. Alternatively, the number of locating channels 334 can reflect the exact number of heat sinks 314 that are needed.

The thin heat sinks 314 are used in systems where the output energy is released from the emitting surfaces of the laser diodes 312 in a pulsed mode as opposed to a CW mode. In pulsed systems, the thermal conduction path, which is a function of the thickness of the heat sinks 314, can be reduced since the average waste heat produced by the laser diodes 312 is less. It should also be noted that the configuration of the substrate 330 in FIGS. 13 and 14 could be reversed such that the spacer elements 325 are located in the locating channels 334 as opposed to the thin heat sinks 314 (i.e. like the configuration in FIGS. 1–6).

Each of these embodiments and obvious variations thereof is contemplated as falling within the spirit and scope of the invention, which is set forth in the following claims.

What is claimed is:

1. A method producing a laser diode assembly comprising the steps of:

providing a laser diode having an emitting surface and a reflective surface;

providing first and second heat sinks each having an upper surface;

providing a spacer element;

placing said spacer element between said first and second heat sinks;

placing said laser diode between said first and second heat sinks with said reflective surface in contact with said spacer element and said emitting surface substantially flush with said upper surfaces of said heat sinks; and soldering said laser diode to said first and second heat sinks.

2. The method of claim 1, wherein said step of placing said laser diode between said heat sinks includes the step of adjusting the position of said spacer element so as to move said emitting surface into a substantially flush position with respect to said upper surfaces of said heat sinks.

3. The method of claim 2, wherein said step of adjusting said position of said spacer element includes the steps of removing said spacer element from its position between said first and second heat sinks and placing between said heat sinks a new spacer element having different dimensional characteristics.

4. The method of claim 1, further including the steps of:

providing a non-conductive substrate;

placing said heat sinks on said non-conductive substrate; and soldering said heat sinks to said non-conductive substrate.

5. The method of claim 4, wherein said non-conductive substrate includes a locating channel for said spacer element, said step of placing said spacer element between said heat sinks includes the step of locating said spacer element within said locating channel.

6. The method of claim 4, wherein said steps of soldering said heat sinks to said non-conductive substrate and soldering said laser diode to said heat sinks occur by simultaneous heating of said laser diode assembly.

7. The method of claim 4, further including the step of applying a solder layer to exterior surfaces of said heat sinks prior to said step of placing said spacer element between said heat sinks.

8. The method of claim 1, wherein said spacer element is gallium arsenide.

9. The method of claim 1, wherein said spacer element is a polymeric material.

10. The method of claim 9, wherein said polymeric material is nylon.

11. The method of claim 1, wherein said spacer element is a glass fiber.

12. The method of claim 1, further including the step of removing said spacer element.

13. A method of producing a laser diode assembly including a laser diode mounted between first and second heat sinks, said laser diode having an emitting surface and a reflective surface, said first and second heat sinks each having an upper surface, said method comprising:

positioning a spacer element between said first and second heat sinks;

contacting said reflective surface of said laser diode with said spacer element;

registering said emitting surface in a substantially flush position with respect to said upper surfaces of said heat sinks; and soldering said laser diode to said first and second heat sinks.

14. The method of claim 13, wherein said spacer element is gallium arsenide.

15. The method of claim 13, wherein said spacer element is a polymeric material.

16. The method of claim 15, wherein said polymeric material is nylon.

17. The method of claim 13, wherein said spacer element is a glass fiber.

18. The method of claim 13, wherein said registering of said emitting surface includes removing said spacer element from its initial position between said first and second heat sinks.

19. The method of claim 18, wherein said registering of said emitting surface further includes adding a new spacer element having different dimensional characteristics.

20. The method of claim 13, further including removing said spacer element.

21. The method of claim 13, further including moving said first and second heat sinks toward each other.

22. The method of claim 13, wherein said laser diode assembly further includes a thermally conductive lower substrate and said method further comprises:

placing said heat sinks on said substrate; and soldering said heat sinks to said substrate.

23. The method of claim 22, wherein said substrate includes a locating channel for said spacer element, said positioning said spacer element between said heat sinks includes locating said spacer element within said locating channel.

24. The method of claim 22, wherein said soldering said heat sinks to said substrate and said soldering said laser diode to said heats sinks occur by the simultaneous heating of said laser diode assembly.

25. The method of claim 13, further including applying a solder layer to exterior surfaces of said heat sinks that are to contact said laser diode.

26. The method of claim 25, wherein said solder layer is between about 0.001 and 0.005 inch in thickness.

27. The method of claim 25, wherein said solder layer contains indium.

28. The method of claim 27, wherein said soldering said laser diode to said heat sink includes contacting said heat sinks with a hot plate.

29. The method of claim 28, further including applying a rosin-activated flux to exterior surfaces of said heat sinks prior to soldering said laser diode to said heat sinks.

30. The method of claim 3, further including leaving said spacer element in said assembly.

31. A method of producing a laser diode assembly including a laser diode mounted between fist and second heat sinks, said heat sinks being in thermal communication with a lower substrate, said laser diode having an emitting surface and a reflective surface, said heat sinks having an upper surface opposite said lower substrate, said method comprising:

providing a layer of solder to exterior surfaces of said first and second heat sinks; positioning said first and second heat sinks on said lower substrate;

locating a spacer element between said first and second heat sinks;

placing said laser diode above said spacer element and adjacent to said solder layers on said first and second heat sinks;

registering said emitting surface in a substantially flush position with respect to said upper surfaces of said heat sinks;

heating said heat sinks to a temperature above a melting point of said solder layer; and cooling said heat sinks to a temperature below said melting point of said solder.

32. The method of claim 31, further including applying a rosin-activated flux to said solder layers on said heat sinks prior to heating said heat sinks.

33. The method of claim 31, wherein said step of healing includes contacting said heat sinks to a hot plate that conducts heat into said heat sinks.

34. The method of claim 31, further including soldering said heat sinks to said lower substrate.

35. The method of claim 34, wherein said step of soldering said heat sinks to said lower substrate is accomplished by said heating step and said cooling step.

36. The method of claim 31, further including the step of removing said spacer element from between said heat sinks.

37. A method of producing a laser diode array assembly including a plurality of laser diodes, each of said plurality of laser diodes being mounted between two heat sinking structures and having an emitting surface and a reflective surface, said heat sinking structures having an upper surfaces, said method comprising:

arranging a plurality of heat sinking structures such that a gap exists between adjacent ones of said plurality of heat sinking structures;

positioning a spacer element in each of said gaps;

placing each of said plurality of laser diodes in a respective one of said gaps above one of said spacer elements;

registering said emitting surfaces of said plurality of laser diodes in a substantially flush position with respect to said upper surfaces of said heat sinking structures; and soldering each of said plurality of laser diodes to said adjacent heat sinking structures.

38. The method of claim 37, wherein said soldering of each of said plurality of laser diodes is accomplished through one step of heating said heat sinking structures.

39. The method of claim 37, further including removing said spacer elements.

40. The method of claim 37, further including soldering said heat sinking structures to a lower substrate.

* * * * *